(12) United States Patent
Chen et al.

(10) Patent No.: US 8,421,509 B1
(45) Date of Patent: Apr. 16, 2013

(54) CHARGE PUMP CIRCUIT WITH LOW CLOCK FEED-THROUGH

(75) Inventors: Chien-Liang Chen, Taoyuan County (TW); Ya-Nan Mou, Hsinchu (TW); Yuan-Hui Chen, Hsinchu (TW); Yu-Jen Chang, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/280,366

(22) Filed: Oct. 25, 2011

(51) Int. Cl.
*H03L 7/06* (2006.01)

(52) U.S. Cl.
USPC .......................................... 327/157; 327/148

(58) Field of Classification Search .................. 327/148, 327/156, 157, 536; 375/374
See application file for complete search history.

(56) References Cited

U.S. PATENT DOCUMENTS

| | | | |
|---|---|---|---|
| 3,663,828 A | 5/1972 | Low |
| 3,818,402 A | 6/1974 | Golaski |
| 4,163,944 A | 8/1979 | Chambers |
| 4,245,355 A | 1/1981 | Pascoe |
| 4,409,608 A | 10/1983 | Yoder |
| 4,816,784 A | 3/1989 | Rabjohn |
| 5,159,205 A | 10/1992 | Gorecki |
| 5,208,725 A | 5/1993 | Akcasu |
| 5,212,653 A | 5/1993 | Tanaka |
| 5,406,447 A | 4/1995 | Miyazaki |
| 5,446,309 A | 8/1995 | Adachi |
| 5,508,660 A | 4/1996 | Gersbach |
| 5,583,359 A | 12/1996 | Ng |
| 5,637,900 A | 6/1997 | Ker |
| 5,760,456 A | 6/1998 | Grzegorek |
| 5,808,330 A | 9/1998 | Rostoker |
| 5,923,225 A | 7/1999 | De Los Santos |
| 5,959,820 A | 9/1999 | Ker |
| 6,008,102 A | 12/1999 | Alford |
| 6,081,146 A | 6/2000 | Shiochi |
| 6,172,378 B1 | 1/2001 | Hull |
| 6,194,739 B1 | 2/2001 | Ivanov |
| 6,246,271 B1 | 6/2001 | Takada |
| 6,285,578 B1 | 9/2001 | Huang |
| 6,291,872 B1 | 9/2001 | Wang |
| 6,370,372 B1 | 4/2002 | Molnar |
| 6,407,412 B1 | 6/2002 | Iniewski |
| 6,427,226 B1 | 7/2002 | Mallick |
| 6,448,858 B1 | 9/2002 | Helms |

(Continued)

OTHER PUBLICATIONS

Chen, U.S. Appl. No. 13/190,555, filed Jul. 26, 2011.

(Continued)

*Primary Examiner* — Long Nguyen
(74) *Attorney, Agent, or Firm* — Winston Hsu; Scott Margo

(57) ABSTRACT

A charge pump circuit includes a first comparator, a PMOS tuner, a first current mirror, a first NMOS transistor, a first PMOS switch, an NMOS tuner, a second current mirror, a first PMOS transistor and a first NMOS switch. The first PMOS switch is coupled between the PMOS tuner and a first output PMOS transistor of the first current mirror, thus the parasitic capacitor formed between the gate and the drain of the first PMOS switch, the parasitic capacitor formed between the gate and the source of the first output PMOS transistor, and the parasitic capacitor formed between the gate and the drain of the first output PMOS transistor are equivalently coupled in series, lowering the capacitance between the PMOS tuner and the charge pump output, and reducing the clock feed through and the charge injection effect in the charge pump circuit.

6 Claims, 7 Drawing Sheets

U.S. PATENT DOCUMENTS

| Patent Number | Kind | Date | Name | Ref |
|---|---|---|---|---|
| 6,452,442 | B1 | 9/2002 | Laude | |
| 6,456,221 | B2 | 9/2002 | Low | |
| 6,461,914 | B1 | 10/2002 | Roberts | |
| 6,480,137 | B2 | 11/2002 | Kulkarni | |
| 6,483,188 | B1 | 11/2002 | Yue | |
| 6,486,765 | B1 | 11/2002 | Katayanagi | |
| 6,509,805 | B2 | 1/2003 | Ochiai | |
| 6,518,165 | B1 | 2/2003 | Yoon | |
| 6,521,939 | B1 | 2/2003 | Yeo | |
| 6,545,547 | B2 | 4/2003 | Fridi | |
| 6,560,306 | B1 | 5/2003 | Duffy | |
| 6,588,002 | B1 | 7/2003 | Lampaert | |
| 6,593,838 | B2 | 7/2003 | Yue | |
| 6,603,360 | B2 | 8/2003 | Kim | |
| 6,608,363 | B1 | 8/2003 | Fazelpour | |
| 6,611,223 | B2 | 8/2003 | Low | |
| 6,625,077 | B2 | 9/2003 | Chen | |
| 6,630,897 | B2 | 10/2003 | Low | |
| 6,639,298 | B2 | 10/2003 | Chaudhry | |
| 6,653,868 | B2 | 11/2003 | Oodaira | |
| 6,668,358 | B2 | 12/2003 | Friend | |
| 6,700,771 | B2 | 3/2004 | Bhattacharyya | |
| 6,717,446 | B1 | 4/2004 | Vu | |
| 6,720,608 | B2 | 4/2004 | Lee | |
| 6,724,677 | B1 | 4/2004 | Su | |
| 6,756,656 | B2 | 6/2004 | Lowther | |
| 6,795,001 | B2 | 9/2004 | Roza | |
| 6,796,017 | B2 | 9/2004 | Harding | |
| 6,798,011 | B2 | 9/2004 | Adan | |
| 6,810,242 | B2 | 10/2004 | Molnar | |
| 6,822,282 | B2 | 11/2004 | Randazzo | |
| 6,822,312 | B2 | 11/2004 | Sowlati | |
| 6,833,756 | B2 | 12/2004 | Ranganathan | |
| 6,841,847 | B2 | 1/2005 | Sia | |
| 6,847,572 | B2 | 1/2005 | Lee | |
| 6,853,272 | B1 | 2/2005 | Hughes | |
| 6,876,056 | B2 | 4/2005 | Tilmans | |
| 6,885,534 | B2 | 4/2005 | Ker | |
| 6,901,126 | B1 | 5/2005 | Gu | |
| 6,905,889 | B2 | 6/2005 | Lowther | |
| 6,909,149 | B2 | 6/2005 | Russ | |
| 6,927,664 | B2 | 8/2005 | Nakatani | |
| 6,958,522 | B2 | 10/2005 | Clevenger | |
| 7,009,252 | B2 | 3/2006 | Lin | |
| 7,027,276 | B2 | 4/2006 | Chen | |
| 7,205,612 | B2 | 4/2007 | Cai | |
| 7,262,069 | B2 | 8/2007 | Chung | |
| 7,365,627 | B2 | 4/2008 | Yen | |
| 7,368,761 | B1 | 5/2008 | Lai | |
| 7,405,642 | B1 | 7/2008 | Hsu | |
| 7,672,100 | B2 | 3/2010 | Van Camp | |
| 8,063,678 | B2 * | 11/2011 | Wadhwa et al. | 327/157 |
| 8,217,693 | B2 * | 7/2012 | Mei et al. | 327/157 |
| 2001/0052811 | A1 * | 12/2001 | Kim | 327/157 |
| 2002/0019123 | A1 | 2/2002 | Ma | |
| 2002/0036545 | A1 | 3/2002 | Fridi | |
| 2002/0188920 | A1 | 12/2002 | Lampaert | |
| 2003/0042949 | A1 * | 3/2003 | Si | 327/157 |
| 2003/0076636 | A1 | 4/2003 | Ker | |
| 2003/0127691 | A1 | 7/2003 | Yue | |
| 2003/0183403 | A1 | 10/2003 | Kluge | |
| 2005/0068112 | A1 | 3/2005 | Glenn | |
| 2005/0068113 | A1 | 3/2005 | Glenn | |
| 2005/0087787 | A1 | 4/2005 | Ando | |
| 2006/0006431 | A1 | 1/2006 | Jean | |
| 2006/0108694 | A1 | 5/2006 | Hung | |
| 2006/0267102 | A1 | 11/2006 | Cheng | |
| 2007/0102745 | A1 | 5/2007 | Hsu | |
| 2007/0210416 | A1 | 9/2007 | Hsu | |
| 2007/0234554 | A1 | 10/2007 | Hung | |
| 2007/0246801 | A1 | 10/2007 | Hung | |
| 2007/0249294 | A1 | 10/2007 | Wu | |
| 2007/0296055 | A1 | 12/2007 | Yen | |
| 2008/0094166 | A1 | 4/2008 | Hsu | |
| 2008/0185679 | A1 | 8/2008 | Hsu | |
| 2008/0189662 | A1 | 8/2008 | Nandy | |
| 2008/0200132 | A1 | 8/2008 | Hsu | |
| 2008/0299738 | A1 | 12/2008 | Hsu | |
| 2008/0303623 | A1 | 12/2008 | Hsu | |
| 2009/0029324 | A1 | 1/2009 | Clark | |
| 2009/0201625 | A1 | 8/2009 | Liao | |
| 2010/0279484 | A1 | 11/2010 | Wang | |
| 2011/0012653 | A1 | 1/2011 | Li | |

OTHER PUBLICATIONS

Sidiropoulos, "Adaptive Bandwidth DLLs and PLLs using Regulated Supply CMOS Buffers", 2000.

* cited by examiner

CHARGE PUMP CIRCUIT WITH LOW CLOCK FEED-THROUGH

BACKGROUND OF THE INVENTION

1. Field of the Invention

The present invention relates to a charge pump circuit, especially a charge pump circuit having reduced clock feed-through, reduced charge injection and reduced up/down current mismatch.

2. Description of the Prior Art

Phase locked loop (PLL) circuits are utilized in various types of electronic devices and systems. The PLL circuits are typically utilized in devices for clock signal generation, clock sampling, signal synchronization and frequency synthesis for generating clocks and signals. Charge pump circuits are often used for changing voltage levels in PLL circuits.

Please refer to FIG. 1. FIG. 1 shows a prior art charge pump circuit 100. The charge pump circuit 100 includes a charge current mirror 10, a discharge current mirror 20, a p-channel metal-oxide semiconductor (PMOS) switch K5, and an n-channel MOS (NMOS) switch K6. The charge current mirror 10 comprises PMOS transistors K1 and K2, both coupled to a voltage source $V_{DD}$ for providing a charge current $I_{up}$. The discharge current mirror 20 comprises NMOS transistors K3 and K4, both coupled to ground for providing a discharge current $I_{dn}$.

The PMOS switch K5 and the NMOS switch K6 are both coupled to a charge pump output OUT and controlled by control signals UN and DP generated from a phase frequency detector (PFD) 30. However, when the control signals change from HIGH to LOW or from LOW to HIGH, the state transitions may cause an unwanted voltage swing at the charge pump output OUT due to parasitic capacitors Cgsp, Cgdp, Cgsn, and Cgdn coupled to the PMOS switch K5 and the NMOS switch K6. The above voltage swing effect is called clock feed-through.

Besides, when the PMOS switch K5 and NMOS switch K6 are turned off, the charge in the depletion region of the channel will be injected to the parasitic capacitors Cgsp, Cgdp, Cgsn and Cgdn, also causing an unwanted voltage swing at the charge pump output OUT. The above voltage swing effect is called charge injection.

Further, the voltage swing may cause the up/down current mismatch to the charge pump circuit 100. For example, when the voltage level at the charge pump output OUT becomes higher, the drain-to-source voltage of the NMOS transistor K4 will be higher, increasing the current flowing from the charge pump output OUT through the NMOS switch K6. Moreover, when the voltage level at the charge pump output OUT becomes higher, the source-to-drain voltage of the PMOS transistor K2 will become lower, lowering the current flowing from the voltage source $V_{DD}$ through the PMOS transistor K2.

The aforementioned clock feed through, charge injection and up/down current mismatch effect caused by the voltage swing of the charge pump output OUT will result in spurious noise in the output signals generated from the charge pump output OUT, deteriorating the quality of the generated output signals.

SUMMARY OF THE INVENTION

An embodiment of the present invention provides a charge pump circuit. The charge pump circuit comprises a first comparator, a PMOS tuner, a first current mirror, a first NMOS transistor, a first PMOS switch, an NMOS tuner, a second current mirror, a first PMOS transistor, and a first NMOS switch. The first comparator has a first input end, a second input end, and an output end coupled to the second input end of the first comparator. The PMOS tuner has a source coupled to a voltage source, and a gate for receiving a first bias voltage. The first current mirror comprises a source PMOS transistor and a first output PMOS transistor. The source PMOS transistor has a source coupled to the voltage source, and a gate coupled to a drain of the source PMOS transistor. The first output PMOS transistor has a gate coupled to the gate of the source PMOS transistor, and a drain coupled to the first input of the first comparator. The first NMOS transistor has a drain coupled to the gate of the first output PMOS transistor, a gate coupled to the output end of the first comparator, and a source coupled to ground. The first PMOS switch has a drain coupled to the source of the first output PMOS transistor, a source coupled to a drain of the PMOS tuner, and a gate for receiving a first control signal. The NMOS tuner has a source coupled to ground, and a gate for receiving a second bias voltage. The second current mirror comprises a source NMOS transistor and a first output NMOS transistor. The NMOS transistor has a source coupled to ground, and a gate coupled to a drain of the source NMOS transistor. The first output NMOS transistor has a gate coupled to the gate of the source NMOS transistor, and a drain coupled to the first input of the first comparator. The first PMOS transistor has a drain coupled to the gate of the first output NMOS transistor, a gate coupled to the output end of the first comparator, and a source coupled to the voltage source. The first NMOS switch has a drain coupled to the source of the first output NMOS transistor, a source coupled to the drain of the NMOS tuner, and a gate for receiving a second control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
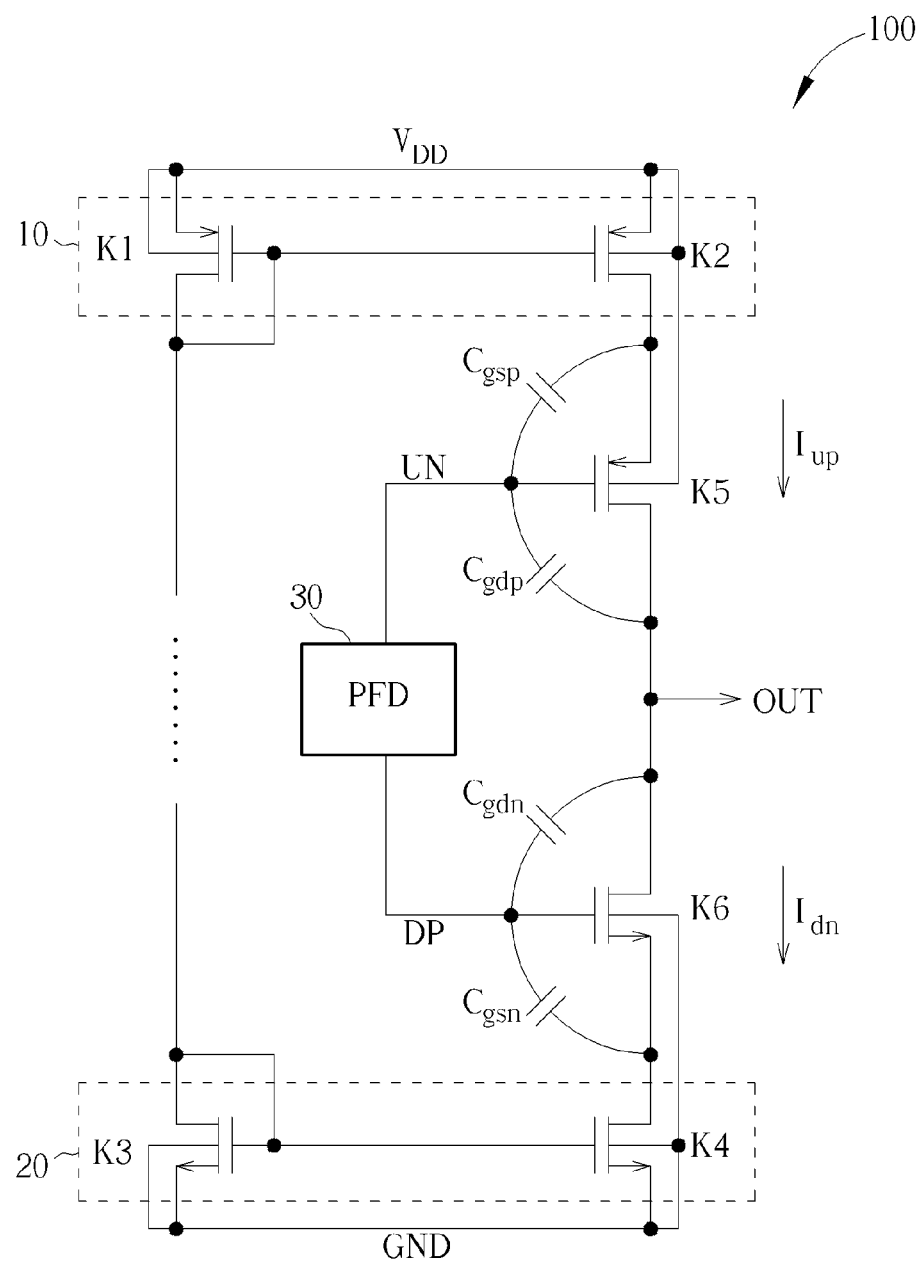
FIG. 1 shows a prior art charge pump circuit.
Figure 2:
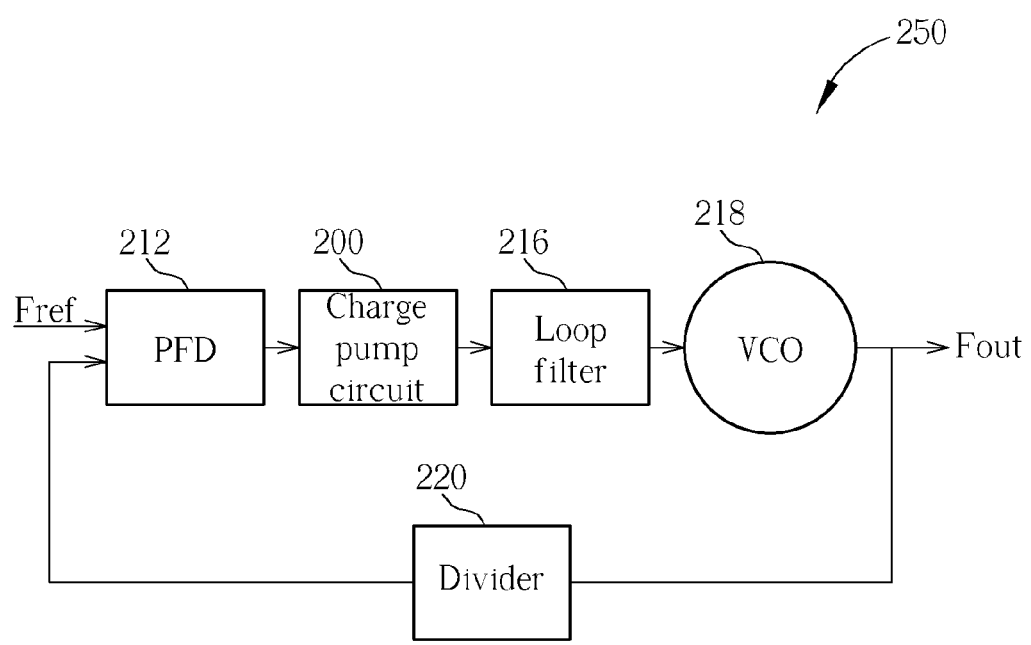
FIG. 2 shows a block diagram of the PLL circuit of the present invention.

Please refer to FIG. 2. FIG. 2 shows a block diagram of a PLL circuit 250 of the present invention. The PLL circuit 250 includes a phase frequency detector (PFD) 212, a charge pump circuit 200, a loop filter 216, a voltage controlled oscillator (VCO) 218, and a divider 220. The PLL circuit 250 receives an input reference signal $F_{ref}$ and generates an output signal $F_{out}$. The divider 220 divides the output signal $F_{out}$ to generate a feedback signal. For generating the output signal $F_{out}$ the PFD 212 monitors the phase or frequency difference between the input reference signal $F_{ref}$ and the feedback signal. After comparing the phase or frequency differences between the input reference signal $F_{ref}$ and the feedback signal, the PFD 212 generates control signals and transmits the control signals to the charge pump circuit 200. The charge pump circuit 200 generates a charge current to charge the load capacitor in the loop filter 216 or a discharge current to discharge the load capacitor in the loop filter 216.

The charging and discharging of the load capacitor in the loop filter 216 will affect an output voltage of the loop filter 216 delivered to the VCO 218. The VCO 218 changes the phase or frequency of the output signal $F_{out}$ according to the voltage outputted from the loop filter 216. According to the above configuration, the PLL circuit 250 continuously modifies the output signal $F_{out}$ according to the input reference signal $F_{ref}$.

Figure 3:
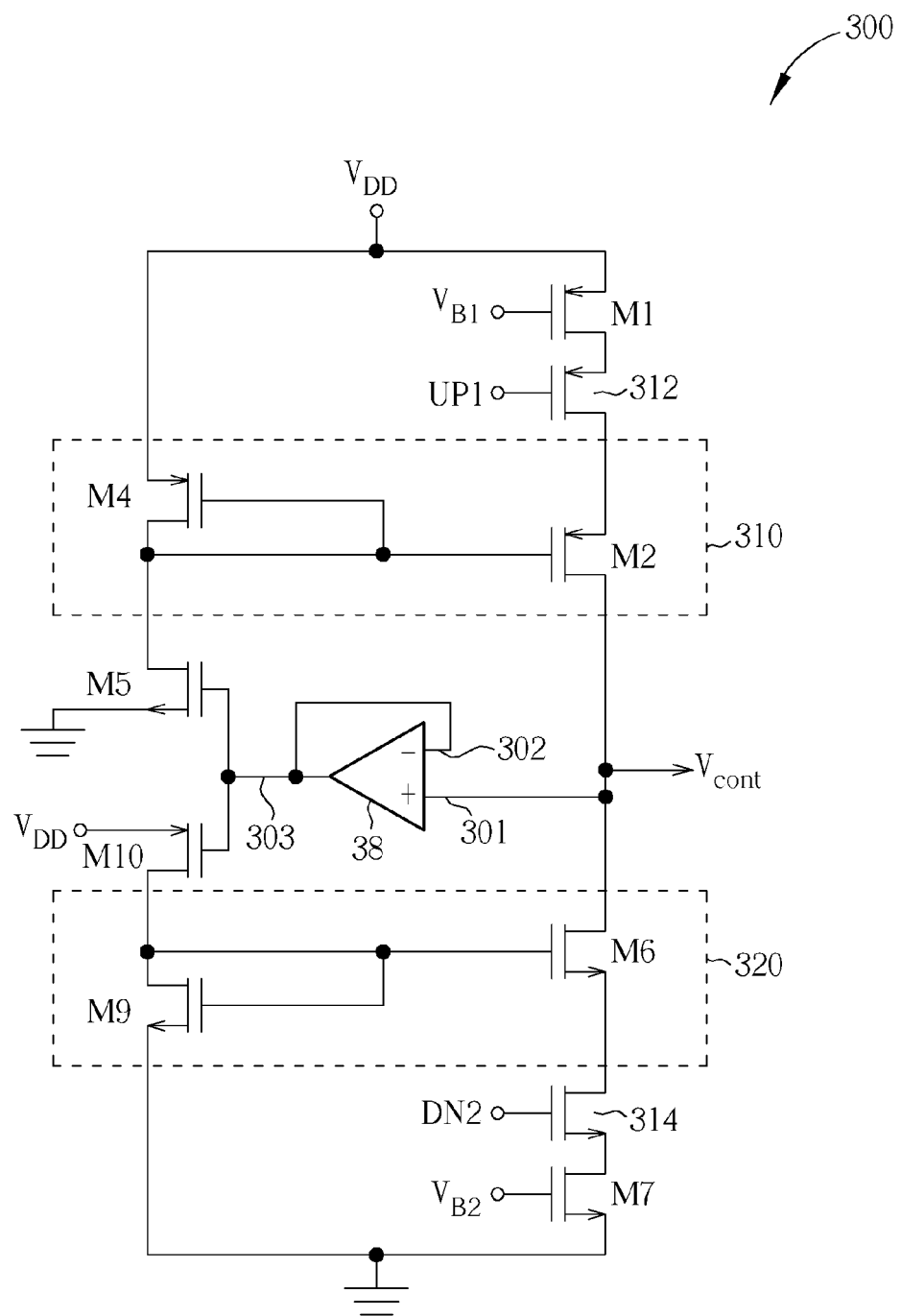
FIG. 3 shows the charge pump circuit of the first embodiment of the present invention.

Please refer to FIG. 3. FIG. 3 shows a charge pump circuit 300 of the first embodiment of the present invention. The charge pump circuit 300 comprises a first comparator 38, a PMOS tuner M1, a first current mirror 310, a first NMOS transistor M5, a first PMOS switch 312, an NMOS tuner M7, a second current mirror 320, a first PMOS transistor M10 and a first NMOS switch 314. The first comparator 38 has a first input end 301, a second input end 302, and an output end 303 coupled to the second input end 302 of the first comparator 38. The PMOS tuner M1 has a source coupled to a voltage source $V_{DD}$, and a gate for receiving a first bias voltage $V_{B1}$. The first current mirror comprises a source PMOS transistor M4 and a first output PMOS transistor M2. The source PMOS transistor M4 has a source coupled to the voltage source $V_{DD}$, and a gate coupled to a drain of the source PMOS transistor M4. The first output PMOS transistor M2 has a gate coupled to the gate of the source PMOS transistor M4, and a drain coupled to the first input 301 of the first comparator 38. The first NMOS transistor M5 has a drain coupled to the gate of the first output PMOS transistor M2, a gate coupled to the output end 303 of the first comparator 38, and a source coupled to ground. The first PMOS switch 312 has a drain coupled to the source of the first output PMOS transistor M2, a source coupled to a drain of the PMOS tuner M1, and a gate for receiving a first control signal UP1.

The NMOS tuner M7 has a source coupled to ground, and a gate for receiving a second bias voltage $V_{B2}$. The second current mirror 320 comprises a source NMOS transistor M9 having a source coupled to ground, and a gate coupled to a drain of the source NMOS transistor M9. The second current mirror 320 further comprises a first output NMOS transistor M6 having a gate coupled to the gate of the source NMOS transistor M9, and a drain coupled to the first input 301 of the first comparator 38. The first PMOS transistor M10 has a drain coupled to the gate of the first output NMOS transistor M6, a gate coupled to the output end 303 of the first comparator 38, and a source coupled to the voltage source $V_{DD}$. The first NMOS switch 314 has a drain coupled to the source of the first output NMOS transistor M6, a source coupled to the drain of the NMOS tuner M7, and a gate for receiving a second control signal DN2.

In general, the first control signal UP1 is a logical inverse of the second control signal DN2. However, depending on the types of components, the first control signal UP1 and the second control signal DN2 may have the same logical value.

In the first embodiment, when the voltage swing occurs at the charge pump output $V_{cont}$, the clock feed through, charge injection and up/down current mismatch effect can be reduced, thus the quality of the generated signals at the charge pump output $V_{cont}$ will not be deteriorated. For example, when the voltage level at the charge pump output $V_{cont}$ becomes higher, the drain-to-source voltage of the first output NMOS transistor M6 will also become higher. Due to the channel length modulation effect, the increase of the drain-to-source voltage of the first output NMOS transistor M6 may increase the current flowing from the charge pump output $V_{cont}$ through the first output NMOS transistor M6. On the other hand, when the voltage level at the charge pump output $V_{cont}$ becomes higher, the source-to-gate voltage of the first PMOS transistor M10 will become lower due to the configuration of the first comparator 38, and the current flowing through the source NMOS transistor M9 will also become lower, thus lowering the gate-to-source voltage of the source NMOS transistor M9, and the gate-to-source voltage of the first output NMOS transistor M6 will also become lower due to the configuration of the second current mirror 320. Therefore, since the gate-to-source voltage of the first output NMOS transistor M6 is lower, the abovementioned channel length modulation effect can be moderated, and the magnitude of the current flowing from the charge pump output $V_{cont}$ through the first output NMOS M6 will not be substantially affected.

That is, though the drain-to-source voltage of the first output NMOS transistor M6 increases due to the increase of the voltage level of the charge pump output $V_{cont}$, the gate-to-source voltage of the first output NMOS transistor M6 will also increase, moderating the channel length modulation effect. Therefore, the current flowing from the charge pump output $V_{cont}$ through the first output NMOS transistor M6 will not increase with the increase of the voltage level of the charge pump output $V_{cont}$. Similarly, the current flowing from the voltage source through the first output PMOS transistor M2 will not decrease with the increase of the charge pump output $V_{cont}$. Hence, the voltage swing at the charge pump output $V_{cont}$ will not substantially affect the magnitude of the current flowing from the voltage source $V_{DD}$ through the first output PMOS transistor M2 and the current flowing from the charge pump output $V_{cont}$ through the first output NMOS transistor M6.

Therefore, in the first embodiment, when the voltage swing occurs at the charge pump output $V_{cont}$, the up/down current mismatch effect can be reduced, thus the quality of the generated signals at the charge pump output $V_{cont}$ can be maintained.

Figure 4:
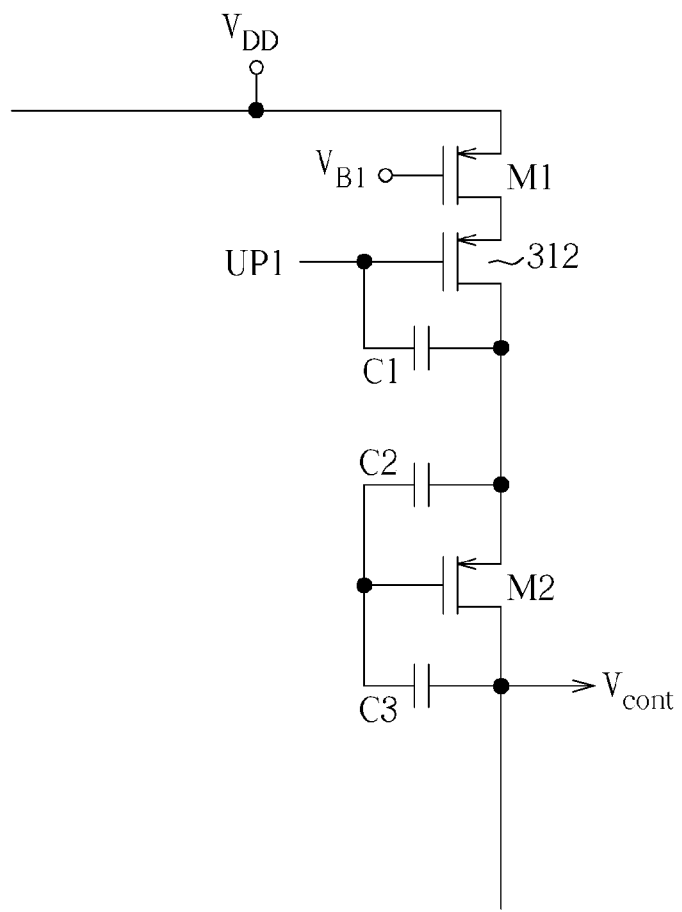
FIG. 4 shows an explanatory view of the charge pump circuit in FIG. 3.

Please refer to FIG. 4. FIG. 4 shows an explanatory view of the charge pump circuit 300. Since the first PMOS switch 312 is coupled between the PMOS tuner M1 and the first output PMOS transistor M2, the parasitic capacitor C1 formed between the gate and the drain of the first PMOS switch 312, the parasitic capacitor C2 formed between the gate and the source of the first output PMOS transistor M2, and the parasitic capacitor C3 formed between the gate and the drain of the first output PMOS transistor M2 are equivalently coupled in series, thus lowering the capacitance between the PMOS tuner M1 and the charge pump output $V_{cont}$. Therefore, the clock feed through and the charge injection effect can be reduced in the charge pump circuit 300.

Figure 5:
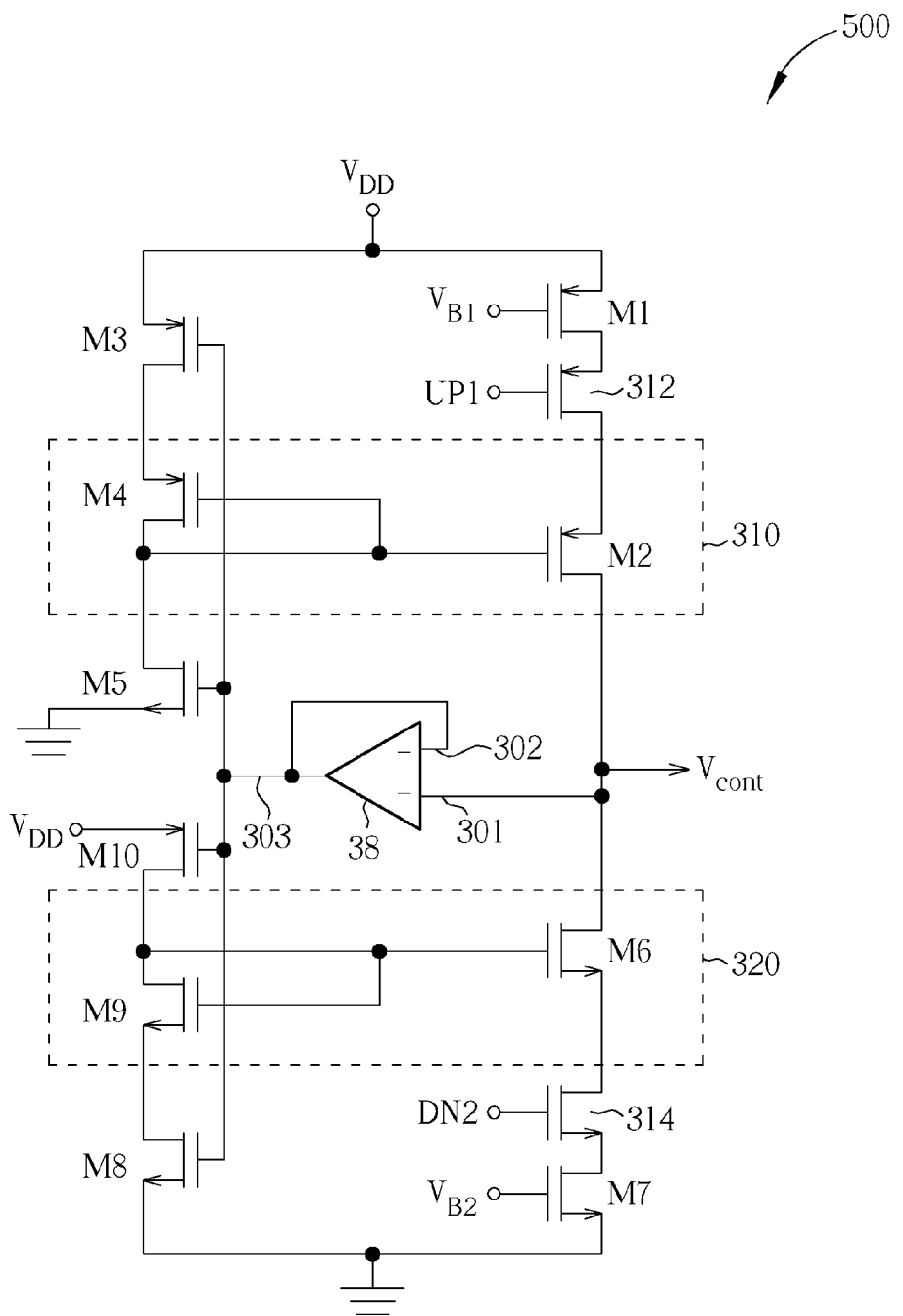
FIG. 5 shows the charge pump circuit of the second embodiment of the present invention.

Please refer to FIG. 5. FIG. 5 shows a charge pump circuit 500 of the second embodiment of the present invention. The difference between the charge pump circuit 500 and the charge pump circuit 300 is that the charge pump circuit 500 further comprises a second PMOS switch M3 and a second NMOS switch M8. The second PMOS switch M3 has a drain coupled to the source of the source PMOS transistor M4, a source coupled to the voltage source $V_{DD}$, and a gate coupled to the gate of the first NMOS transistor M5.

In the second embodiment, the voltage level at the output end 303 of the first comparator 38 is limited to a range which can turn on the second PMOS switch M3, the first NMOS transistor M5, the second NMOS switch M8 and the first PMOS transistor M10 at the same time. In order to turn on the second PMOS switch M3, the first NMOS transistor M5, the second NMOS switch M8 and the first PMOS transistor M10 at the same time, if the threshold voltage of the second PMOS switch M3 and the first PMOS transistor M10 is $V_{tp}$, and the threshold voltage of the first NMOS transistor M5 and the second NMOS switch M8 is $V_{tn}$, then the voltage level capable of turning on both the second PMOS switch M3 and the first PMOS transistor M10 must be lower than $(V_{DD}\text{-}V_{tp})$, and the voltage level capable of turning on both the first NMOS transistor M5 and the second NMOS switch M8 must be higher than $V_{tn}$. Therefore, the voltage level at the output end 303 of the first comparator 38 capable of turning on the second PMOS switch M3, the first NMOS transistor M5, the second NMOS switch M8 and the first PMOS transistor M10 is between $(V_{DD}\text{-}V_{tp})$ and $V_{tn}$. When the second PMOS switch M3, the first NMOS transistor M5, the second NMOS switch M8 and the first PMOS transistor M10 are turned on, the PMOS tuner M1, the first PMOS switch 312, the first NMOS switch 314 and the NMOS tuner M7 will be turned on, thus forming a current path from the voltage source $V_{DD}$ through PMOS tuner M1, the first PMOS switch 312, the first output PMOS transistor M2, the first output NMOS transistor M6, the first NMOS switch 314 and the NMOS tuner M7 to ground in the charge pump circuit 500. Therefore, the power consumption of the charge pump circuit 500 is reduced.

Figure 6:
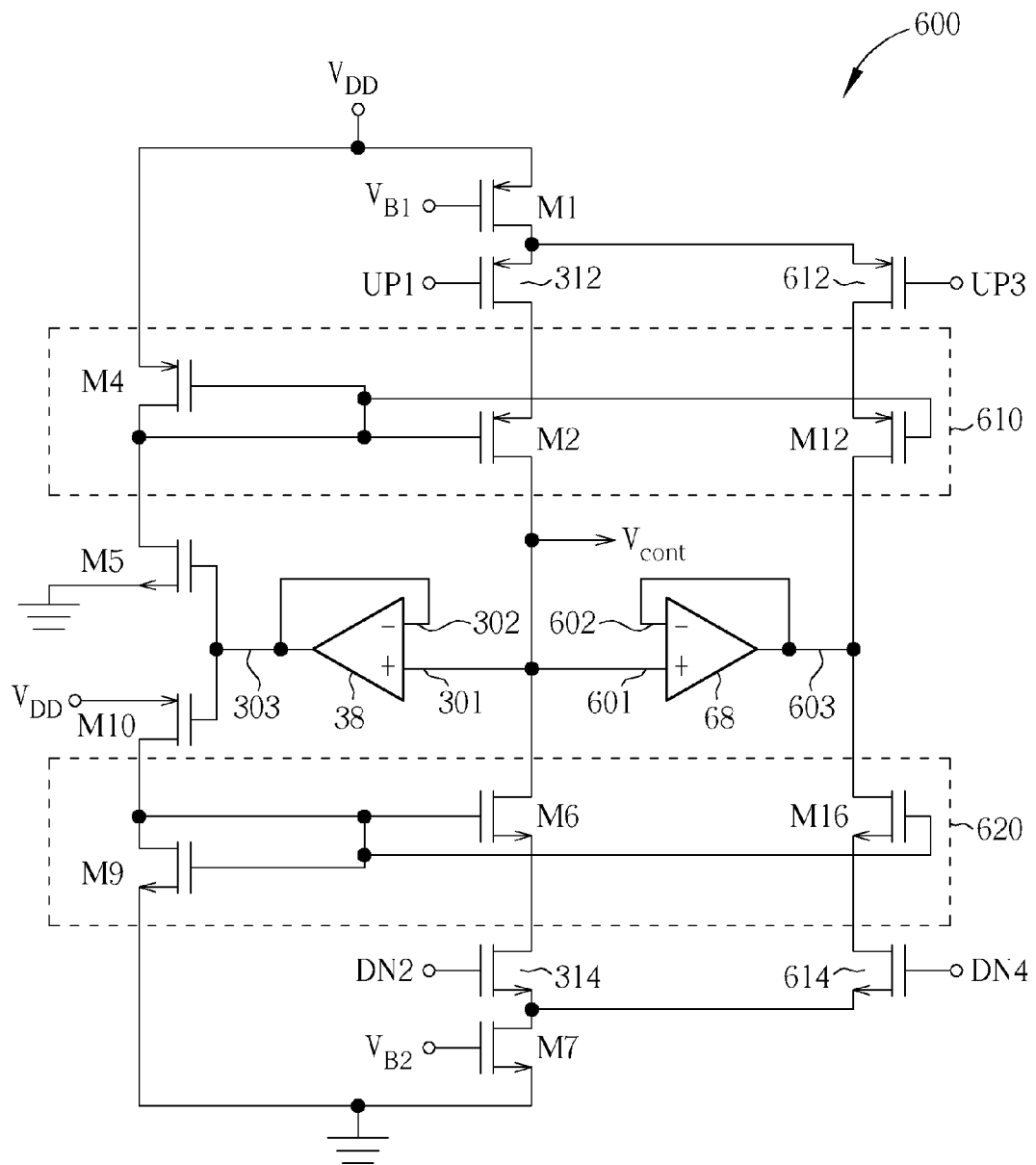
FIG. 6 shows the charge pump circuit of the third embodiment of the present invention.

Please refer to FIG. 6. FIG. 6 shows a charge pump circuit 600 of the third embodiment of the present invention. The difference between the charge pump circuit 600 and the charge pump circuit 300 is that the charge pump circuit 600 further comprises a second comparator 68, a third PMOS switch 612 and a third NMOS switch 614. The first current mirror 610 further comprises a second output PMOS transistor M12. The second current mirror 620 further comprises a second output NMOS transistor M16. The second comparator 68 has a first input end 601 coupled to the first input end 301 of the first comparator 38, a second input end 602, and an output end 603 coupled to the second input end 602 of the second comparator 68. The third PMOS switch 612 has a source coupled to the drain of the PMOS tuner M1, and a gate for receiving a third control signal UP3. The third NMOS switch 614 has a source coupled to the drain of the NMOS tuner M7, and a gate for receiving a fourth control signal DN4. The second output PMOS transistor M12 has a source coupled to a drain of the third PMOS switch 612, a drain coupled to the output end 603 of the second comparator 68, and a gate coupled to the gate of the first output PMOS transistor M2. The second output NMOS transistor M16 has a source coupled to a drain of the third NMOS switch 614, a drain coupled to the drain of the second output PMOS transistor M12, and a gate coupled to the gate of the first output NMOS transistor M6. The first control signal UP1 is a logical inverse of the second control signal DN2 and the third control signal UP3, and the second control signal DN2 is a logical inverse of the fourth control signal DN4.

The charge pump circuit 600 provides another charge and discharge path to prevent the charge sharing effect occurred at the drain of the PMOS tuner M1. For example, when the first PMOS switch 312 is turned on, the third PMOS switch 612 is turned off, and vice versa. By alternating the charge/discharge paths through the first PMOS switch 312 and the third PMOS switch 612, the voltage level at the drain of the PMOS tuner M1 can be refrained below a predetermined value, reducing the aforementioned channel length modulation effect.

Figure 7:
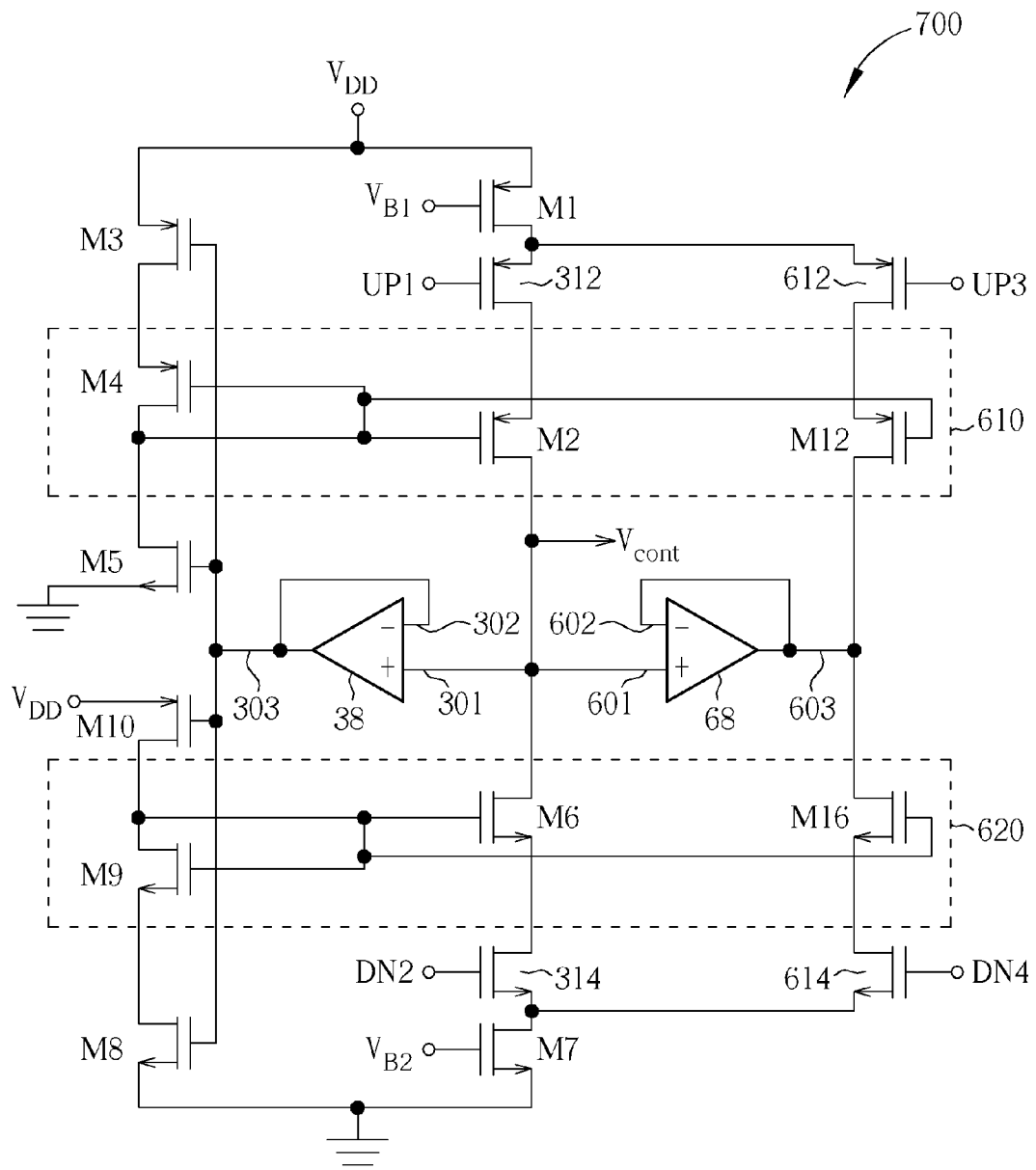
FIG. 7 shows the charge pump circuit of the fourth embodiment of the present invention.

Please refer to FIG. 7. FIG. 7 shows a charge pump circuit 700 of the fourth embodiment of the present invention. The difference between the charge pump circuit 700 and the charge pump circuit 600 is that the charge pump circuit 700 further comprises a second PMOS switch M3 and a second NMOS switch M8. The second PMOS switch M3 has a drain coupled to the source of the source PMOS transistor M4, a source coupled to the voltage source $V_{DD}$, and a gate coupled to the gate of the first NMOS transistor M5.

In the fourth embodiment, the voltage level at the output end 303 of the first comparator 38 is limited to a range which can turn on the second PMOS switch M3, the first NMOS transistor M5, the second NMOS switch M8 and the first PMOS transistor M10 at the same time. In order to turn on the second PMOS switch M3, the first NMOS transistor M5, the second NMOS switch M8 and the first PMOS transistor M10 at the same time, if the threshold voltage of the second PMOS switch M3 and the first PMOS transistor M10 is $V_{tp}$, and the threshold voltage of the first NMOS transistor M5 and the second NMOS switch M8 is $V_{tp}$, then the voltage level capable of turning on both the second PMOS switch M3 and the first PMOS transistor M10 must be lower than $(V_{DD}\text{-}V_{tp})$, and the voltage level capable of turning on both the first NMOS transistor M5 and the second NMOS switch M8 must be higher than $V_{tn}$. Therefore, the voltage level at the output end 303 of the first comparator 38 capable of turning on the second PMOS switch M3, the first NMOS transistor M5, the second NMOS switch M8 and the first PMOS transistor M10 is between $(V_{DD}\text{-}V_{tp})$ and $V_{tn}$. When the second PMOS switch M3, the first NMOS transistor M5, the second NMOS switch M8 and the first PMOS transistor M10 are turned on, the PMOS tuner M1, the first PMOS switch 312, the first NMOS switch 314 and the NMOS tuner M7 will be turned on, thus forming a current path from the voltage source $V_{DD}$ through PMOS tuner M1, the first PMOS switch 312, the first output PMOS transistor M2, the first output NMOS transistor M6, the first NMOS switch 314 and the NMOS tuner M7 to ground in the charge pump circuit 700. Therefore, the power consumption of the charge pump circuit 700 is reduced.

In the charge pump circuits 300, 500, 600, 700, when the voltage swing occurs at the charge pump output $V_{cont}$, the clock feed through, charge injection and up/down current mismatch effect can be reduced, thus the quality of the generated signals at the charge pump output $V_{cont}$ can be maintained. In the charge pump circuits 500 and 700, the voltage level at the output end 303 of the first comparator 38 is limited to a range, thus forming a current path from the voltage source $V_{DD}$ through PMOS tuner M1, the first PMOS switch 312, the first output PMOS transistor M2, the first output NMOS transistor M6, the first NMOS switch 314 and the NMOS tuner M7 to ground in the charge pump circuits 500 and 700. Therefore, the power consumption of the charge pump circuits 500 and 700 are reduced. In the charge pump circuits 600 and 700, another charge and discharge path is provided to prevent the charge sharing effect occurred at the drain of the PMOS tuner M1, thus reducing the channel length modulation effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A charge pump circuit comprising:
   a first comparator having a first input end, a second input end, and an output end coupled to the second input end of the first comparator;
   a PMOS tuner having a source coupled to a voltage source, and a gate for receiving a first bias voltage;

a first current mirror comprising:
- a source PMOS transistor having a source coupled to the voltage source, and a gate coupled to a drain of the source PMOS transistor; and
- a first output PMOS transistor having a gate coupled to the gate of the source PMOS transistor, and a drain coupled to the first input of the first comparator;

a first NMOS transistor having a drain coupled to the gate of the first output PMOS transistor, a gate coupled to the output end of the first comparator, and a source coupled to ground;

a first PMOS switch having a drain coupled to the source of the first output PMOS transistor, a source coupled to a drain of the PMOS tuner, and a gate for receiving a first control signal;

an NMOS tuner having a source coupled to ground, and a gate for receiving a second bias voltage;

a second current mirror comprising:
- a source NMOS transistor having a source coupled to ground, and a gate coupled to a drain of the source NMOS transistor; and
- a first output NMOS transistor having a gate coupled to the gate of the source NMOS transistor, and a drain coupled to the first input of the first comparator;

a first PMOS transistor having a drain coupled to the gate of the first output NMOS transistor, a gate coupled to the output end of the first comparator, and a source coupled to the voltage source; and a first NMOS switch having a drain coupled to the source of the first output NMOS transistor, a source coupled to the drain of the NMOS tuner, and a gate for receiving a second control signal.

2. The charge pump circuit of claim 1, wherein the first control signal is a logical inverse of the second control signal.

3. The charge pump circuit of claim 1 further comprising:
a second PMOS switch having a drain coupled to the source of the source PMOS transistor, a source coupled to the voltage source, and a gate coupled to the gate of the first NMOS transistor; and
a second NMOS switch having a drain coupled to the source of the source NMOS transistor, a source coupled to ground, and a gate coupled to the gate of the first PMOS transistor.

4. The charge pump circuit of claim 1 further comprising:
a second comparator having a first input end coupled to the first input end of the first comparator, a second input end, and an output end coupled to the second input end of the second comparator;
a third PMOS switch having a source coupled to the drain of the PMOS tuner, and a gate for receiving a third control signal; and
a third NMOS switch having a source coupled to the drain of the NMOS tuner, and a gate for receiving a fourth control signal;
wherein the first current mirror further comprises a second output PMOS transistor having a source coupled to a drain of the third PMOS switch, a drain coupled to the output end of the second comparator, and a gate coupled to the gate of the first output PMOS transistor; and
wherein the second current mirror further comprises a second output NMOS transistor having a source coupled to a drain of the third NMOS switch, a drain coupled to the drain of the second output PMOS transistor, and a gate coupled to the gate of the first output NMOS transistor.

5. The charge pump circuit of claim 4 further comprising:
a second PMOS switch having a drain coupled to the source of the source PMOS transistor, a source coupled to the voltage source, and a gate coupled to the gate of the first NMOS transistor; and
a second NMOS switch having a drain coupled to the source of the source NMOS transistor, a source coupled to ground, and a gate coupled to the gate of the first PMOS transistor.

6. The charge pump circuit of claim 4, wherein the first control signal is a logical inverse of the second control signal and the third control signal, and the second control signal is a logical inverse of the fourth control signal.

* * * * *